United States Patent
Lee et al.

(10) Patent No.: US 6,472,306 B1
(45) Date of Patent: Oct. 29, 2002

(54) METHOD OF FORMING A DUAL DAMASCENE OPENING USING CVD LOW-K MATERIAL AND SPIN-ON-POLYMER

(75) Inventors: Shyh-Dar Lee, Hsinchu (TW); Chung-I Chang, Hsinchu (TW)

(73) Assignee: Industrial Technology Research Institute, Hsin-Chu (TW)

( * ) Notice: Subject to any disclaimer, the term of this patent is extended or adjusted under 35 U.S.C. 154(b) by 123 days.

(21) Appl. No.: 09/655,097

(22) Filed: Sep. 5, 2000

(51) Int. Cl.$^7$ .......................................... H01L 21/4763
(52) U.S. Cl. ...................... 438/623; 438/723; 438/734; 438/738; 438/622; 438/633; 438/637; 438/638
(58) Field of Search ................................. 438/723, 724, 438/725, 734, 735, 738, 740, 744, 622, 623, 633, 634, 637, 638

(56) References Cited

U.S. PATENT DOCUMENTS

| | | | |
|---|---|---|---|
| 5,817,572 A | 10/1998 | Chiang et al. | 438/624 |
| 6,004,883 A | 12/1999 | Yu et al. | 438/706 |
| 6,007,733 A | 12/1999 | Jang et al. | 216/80 |
| 6,010,962 A | 1/2000 | Liu et al. | 438/687 |
| 6,013,581 A | 1/2000 | Wu et al. | 438/734 |
| 6,207,555 B1 * | 3/2001 | Ross | 438/633 |
| 6,211,068 B1 * | 4/2001 | Huang | 438/634 |
| 6,255,232 B1 * | 7/2001 | Chang et al. | 438/780 |
| 6,333,256 B2 * | 12/2001 | Sandhu et al. | 438/623 |
| 6,350,682 B1 * | 2/2002 | Liao | 438/638 |

OTHER PUBLICATIONS

L. Peters, "Pursuing the Perfect Low–K Dielectric," Semi-–Conductor International, Sep. 1998, pp. 64–74.
"International Sematech Validates Manufacturing Capability of Applied Material's Low–K Solution for Copper Interconnects—Successful Results Achieved with Black Diamond for Production of Sub–0.18 Micron Chips", Applied Materials, Feb. 28, 2000.

* cited by examiner

Primary Examiner—Carl Whitehead, Jr.
Assistant Examiner—Khanh Duong
(74) Attorney, Agent, or Firm—George O. Saile; Stephen B. Ackerman; Stephen G. Stanton

(57) ABSTRACT

A method of forming a dual damascene opening, comprising the following steps. A semiconductor structure having at least one exposed metal line is provided. A spin-on-polymer layer is formed over the semiconductor structure and the metal line. A CVD low-k material layer is formed over the spin-on-polymer layer. The CVD low-k material layer is patterned to form a CVD low-k material layer via over the metal line. The spin-on-polymer layer is patterned to form a spin-on-polymer layer via opening continuous and contiguous with the CVD low-k material layer via and exposing a portion of the metal line. The CVD low-k material layer adjacent the CVD low-k material layer via is patterned to form a CVD low-k material layer trench. The spin-on-polymer layer via opening and the CVD low-k material layer trench forming a dual damascene opening.

37 Claims, 6 Drawing Sheets

METHOD OF FORMING A DUAL DAMASCENE OPENING USING CVD LOW-K MATERIAL AND SPIN-ON-POLYMER

BACKGROUND OF THE INVENTION

A high speed logic device with low RC delay back-end-of-line (BEOL) is preferred in present integrated circuit (IC) approaches. Copper (Cu) is chosen for its lower resistance and low dielectric constant (low-k) which minimizes capacitance in BEOL.

Dual damascene structures will be used in the next generation processes and devices. Integration of copper dual damascene structures and low-k material is the predominant trend for IC processes.

Currently, chemical vapor deposition (CVD) low-k material and spin-on-polymer (SOP) are candidates for such low-k materials. However there are many issues that need to be resolved for low-k integration in ultra large-scale integration (ULSI) processes.

SOP is likely an organic material and therefore its chemical structure is similar to photoresist material. So inorganic oxides have been used as hard masks (HM) in etching processes of SOP and the adhesion between HM and the underlying organic low-k material is very important.

U.S. Pat. No. 6,010,962 to Liu et al. describes a method for forming inlaid copper interconnects in an insulating layer without dishing after chemical-mechanical polishing of the excess copper. A lower insulating layer 110 and an upper insulating layer 130, separated by an intervening etch stop layer 120, are formed a substrate 100. The upper and lower insulating layers 110, 130 may be comprised materials formed by, for example, CVD, PECVD, PVD or low-k materials, FSG, HSQ, Flare and PAE2.

U.S. Pat. No. 6,004,883 to Yu et al. describes a method for forming a dual damascene opening and structure through a dielectric layer within a microelectronics fabrication without an etch stop layer. A lower dielectric layer consists of a first dielectric material which is not susceptible to etching within an oxygen containing plasma, such as silicon oxide, silicon nitride, and silicon oxynitride. First vias are formed within the first dielectric material. An upper dielectric layer is formed over the lower dielectric layer and consists of a second dielectric material which is susceptible to etching within an oxygen containing plasma of a ratio of at least 20:1 compared to the first dielectric material. The second dielectric material is then patterned and etched through a hard mask to form second vias coexistent with the first vias and together forming a dual damascene via opening.

U.S. Pat. No. 6,013,581 to Wu et al. describes a method for preventing poisoning of trenches and vias in a dual damascene process. A densification process, such as a plasma treatment, is performed on the surface of the exposed dielectric layer around the openings before the openings are filled with conductive material. The densification process prevents poisoning of the trenches and vias caused by outgassing.

U.S. Pat. No. 5,817,572 to Chiang et al. describes a method for forming interconnections in semiconductor devices. A first patterned dielectric layer is formed over a semiconductor substrate and has a first opening filled with conductive material. A second patterned dielectric layer is formed over the first dielectric layer and has a second opening exposing at least a portion of the conductive material. The first dielectric layer may serve as an etch-stop layer in patterning the second dielectric layer or a separate etch-stop layer may be formed over the first dielectric layer and conductive material before formation of the second dielectric layer.

U.S. Pat. No. 6,007,733 to Jang et al. describes a method for forming a patterned layer within a microelectronics fabrication. An oxygen containing plasma etchable layer, which is also susceptible to etching within a fluorine containing plasma, is formed over a microelectronics substrate. A hard mask layer is then formed over the oxygen containing plasma etchable layer, and a patterned photoresist layer is in turn formed over the hard mask layer. The hard mask is patterned by a first anisotropic plasma etch method and the patterned photoresist layer is stripped from the patterned hard mask layer by a stripping method which does not attack the oxygen containing plasma etchable layer. A second plasma etch method is used to pattern the oxygen containing plasma etchable layer through the patterned hard mask layer. The second plasma etch method is the fluorine containing plasma etch method.

The article entitled "Pursuing the Perfect Low-k Dielectric," Laura Peters, Semiconductor International, Sep. 1998, pp. 64–74, describes various potential low-k dielectric materials, including FSG and HSQ, to be used with copper interconnects.

The press release entitled "International Sematech Validates Manufacturing Capability of Applied Material's Low-k Solution for Copper Interconnects—Successful Results Achieved with Black Diamond for Production of Sub-0.18 Micron Chips," Applied Materials, Feb. 28, 2000, describes a successful evaluation of Applied Materials, Inc.'s Black Diamond™ material (a family of low-k products deposited using the DLK chamber) for production of advanced interconnect structures in copper sub-0.18 micron devices.

SUMMARY OF THE INVENTION

Accordingly, it is an object of the present invention to provide a novel CVD low-k material, and a method of making same, that overcomes the disadvantages of the present low-k materials used with copper dual damascene structures.

Another object of the present invention is to provide a novel CVD low-k material, and a method of making same, whose dielectric constant remains stable despite further processing.

Other objects will appear hereinafter.

It has now been discovered that the above and other objects of the present invention may be accomplished in the following manner. Specifically, a semiconductor structure having at least one exposed metal line is provided. A spin-on-polymer layer is formed over the semiconductor structure and the metal line. A CVD low-k material layer is formed over the spin-on-polymer layer. The CVD low-k material layer is patterned to form a CVD low-k material layer via over the metal line. The spin-on-polymer layer is patterned to form a spin-on-polymer layer via opening continuous and contiguous with the CVD low-k material layer via and exposing a portion of the metal line. The CVD low-k material layer adjacent the CVD low-k material layer via is patterned to form a CVD low-k material layer trench. The spin-on-polymer layer via opening and the CVD low-k material layer trench forming a dual damascene opening.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Problems Known to the Inventors

The following is not to be considered prior art.
Adhesion Issue

Figure 1:
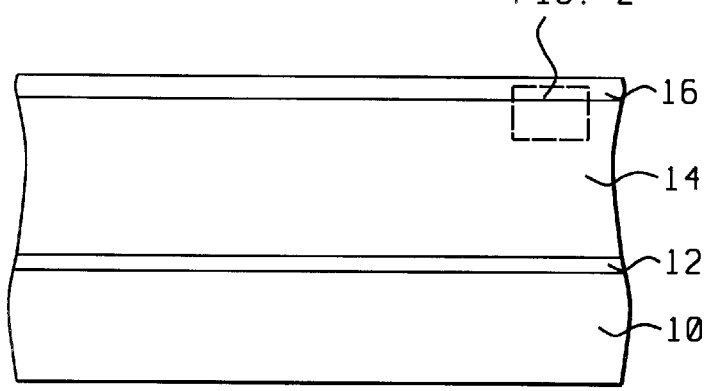
FIGS. 1 and 2 schematically illustrate in cross-sectional representation the adhesion issue with contemporary dual damascene processes.

For example, as shown in FIG. 1, silicon, or other, organic low-k dielectric layer 14 overlies substrate 10 with adhesion promoter layer 12 therebetween. Organic low-k dielectric layer 14 may be comprised of SOP. Hard mask (HM) 16 overlies SOP layer 14 and may consist of an inorganic oxide such as silicon oxide ($SiO_2$).

Figure 2:
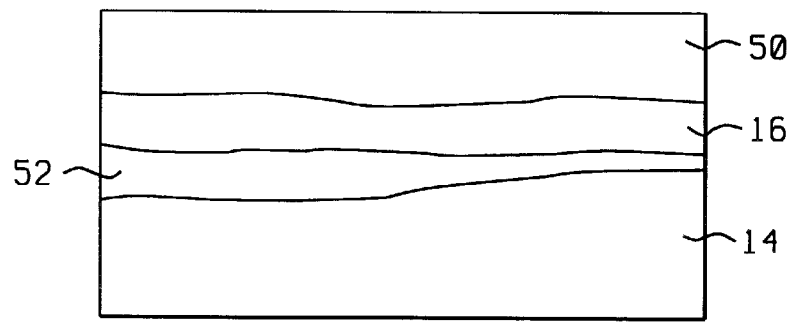
Figure 3:
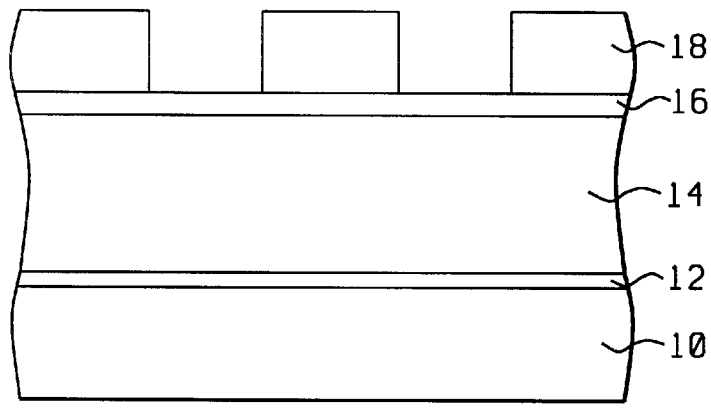
FIG. 3–6 schematically illustrate in cross-sectional representation the gap filling capability of spin-on-polymer issue with contemporary dual damascene processes.

However, as shown in FIG. 2, an enlargement of the area indicated as "FIG. 2" in FIG. 1 with an additional dielectric layer 50 formed over HM 16, the adhesion between inorganic oxide HM 16 and organic low-k dielectric layer 14 needs to improve. Gap 52 indicate delamination, or separation, of HM 16 from dielectric layer 14.
Gap Filling Capability of SOP As shown in FIG. 3, patterned photoresist layer 18 is formed over the structure of FIG. 1.

Figure 4:
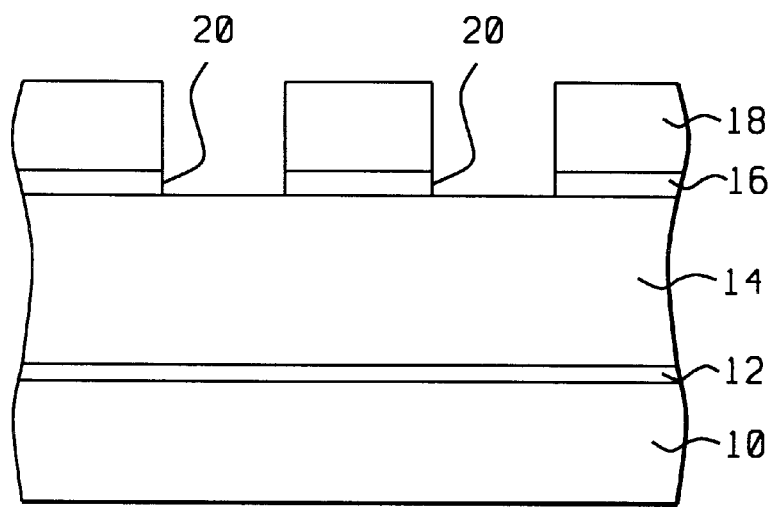

As shown in FIG. 4, $SiO_2$ hard mask layer 16 is etched through patterned photoresist layer 18 forming gaps 20 in hard mask layer 16.

Figure 5:
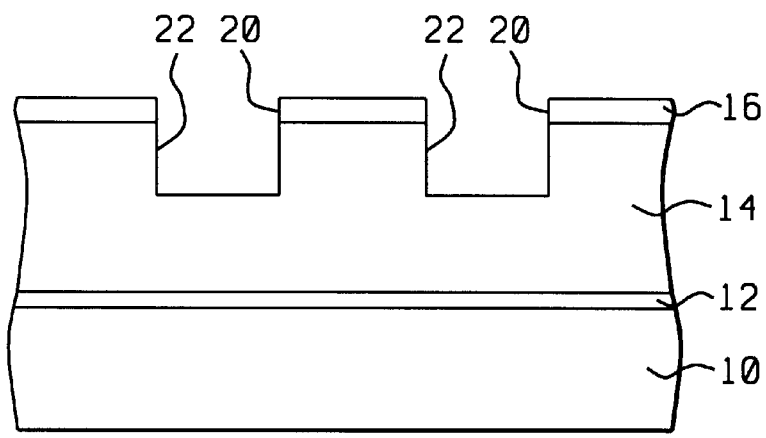

As shown in FIG. 5, when photoresist layer 18 is stripped from patterned hard mask 16 by an oxygen plasma method, the oxygen plasma also etches into SOP layer 14 forming trenches 22 beneath hard mask layer gaps 20.

Figure 6:
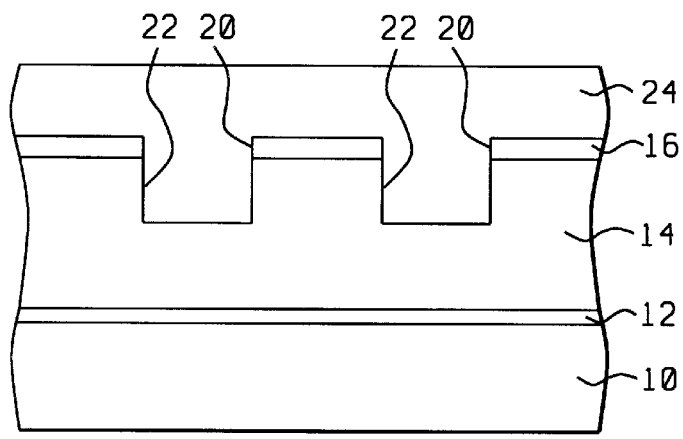
Figure 7:
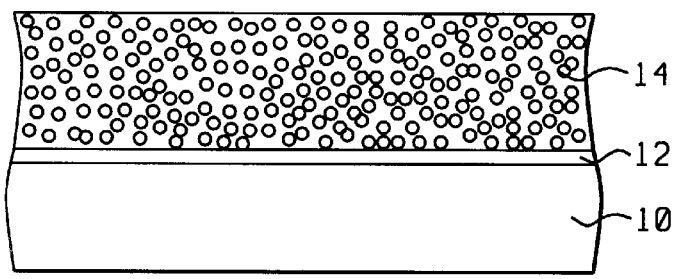
FIG. 7 schematically illustrates in cross-sectional representation the CVD low-k dielectric hardness issue with contemporary dual damascene processes.
Figure 8:
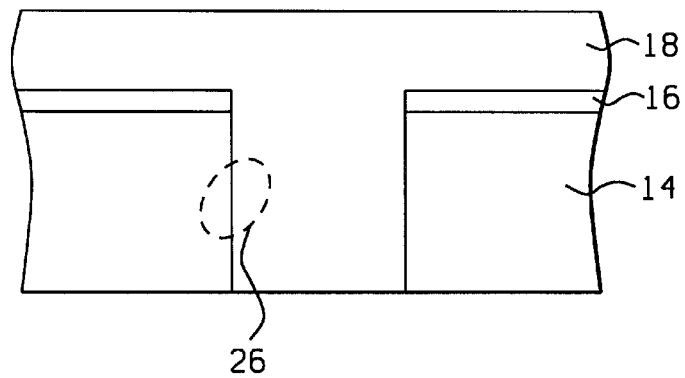
FIG. 8 schematically illustrates in cross-sectional representation the CVD low-k dielectric—photoresist interaction issue with contemporary dual damascene processes.

As shown in FIG. 6, when second SOP layer 24 is then formed over the structure, SOP layer 24 must have the necessary gap filling capability to fill trenches 22 in lower SOP layer 14 and gaps 20 in $SiO_2$ hard mask layer 16. This limits the materials available that may constitute second SOP layer 24.
CVD Process Issues for Low-k Material
  A. Hardness Issue As shown in FIG. 7, substrate 10 has adhesion promoter layer 12 formed thereover with CVD low-k layer 14 formed over adhesion promoter layer 12. CVD low-k layer 14 has a hardness below 1 Gpa and is generally porous and soft. This can lead to package failure.
  B. Interaction with Photoresist As shown in FIG. 8, CVD low-k layer 14 has methyl groups in the side chains. Thus, a reaction between photoresist layer 18 and the exposed portions of CVD low-k layer 14 at 26

Figure 9:
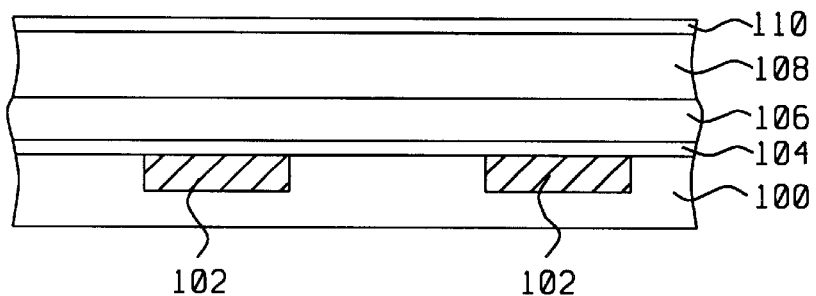
FIGS. 9–16 schematically illustrates in cross-sectional representation the preferred embodiment of the present invention.

Present Invention
Formation of SOP Layer 106 and CVD low-k Layer 108 Over M1 Structure Accordingly, as shown in FIG. 9, semiconductor structure 100 is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

Semiconductor structure 100 includes exposed metal lines 102 preferably comprised of copper (Cu).

Sealing layer (i.e. barrier layer) 104 is formed over semiconductor structure 100 and metal lines 102. Sealing layer 104 is preferably comprised of silicon nitride ($Si_3N_4$).

Spin-on-polymer (SOP) layer 106 is then formed over sealing layer 104. SOP layer 106 is organic and may consist of SiLK™ material by Dow Chemical, FLARE™ material by Allied Signal or Honeywell, and an organic material including C, H, O element such as $CH_3$—$SiO_2$ of TOK series.

SOP layer 106 is preferably from about 1000 to 9000 Å thick, more preferably from about 3000 to 6000 Å thick, and most preferably about 3100 Å thick.

SOP layer 106 is formed as follows:

Including C, H, O element, the functional group of chemical structures are alcohol—ether—ketone—aldehyde—acid—ester and arylate (the conventional materials are such as FLARE (supplied by Honeywell), SiLK (supplied by Dow Chemical), and $CH_3$—$SiO_2$ of TOK series). Spin coater is generally used to develop this film. The solvent is always used as a carrier material. This mixture belongs to beta-stage material. Therefore, a baking process is required at: from about 50 to 280° C. for from about 10 to 90 seconds for multi-stage. Eventually, a curing process is then required at: from about 300 to 450° C. for from about 30 to 90 minutes. Further:
1) RI is from about 1.35 to 1.43;
2) carbon content by FTIR is from about 30 to 65%;
3) oxygen content is from about 10 to 30%;
4) hydrogen content is from about 30 to 65%;
5) silicon content is from about 1 to 10%;
6) hardness is from about 0.5 to 3 Gpa;
7) density is from about 1.5 to 1.8 $g/cm^3$;
8) dielectric constant is from about 2.0 to 2.9;
9) stress is from about compressive $10E^{-8}$ to tensile $10E^{-8}$;
10) breakdown voltage is from about 2 to 9 MV/cm at $10^{-3} A/cm^2$;
11) leakage current at 0.5 MV/cm is from about $<10^{-10}$ to $10^{-12}$ $A/cm^2$; and
12) extinction coefficient is from about 0 to 1.

Layer 108 is formed over SOP layer 106 by an inorganic chemical vapor deposition process (CVD) to create a CVD low-k material layer 108. The CVD low-k material layer 108 generally includes the elements Si, H, O and C. Because Si-O is a major component, this material is an inorganic material.

The chemical structure may be split into two groups. One group has a linear structure and includes materials such as Black Diamond™ (BD) supplied by AMAT, Coral™ supplied by Novellus, povA, carbon doped silicon oxide and Greendot™ supplied by Mattson. The other group has a ring structure and includes materials such as Aurora™ supplied by ASM J. A plasma enhanced chemical vapor deposition (PECVD) tool may be used to develop these films. A spin coater is also a good process tool for inorganic materials.

CVD low-k layer 108 is from about 1000 to 9000 Å thick, and is preferably from about 3000 to 6000 Å thick.

CVD low-k layer 108 is formed as follows:
1) RI is from about 1.30 to 1.67;
2) carbon content by FTIR is from about 5 to 50%;
3) oxygen content is from about 10 to 30%;
4) hydrogen content is from about 10 to 30%;
5) modulus is from about 40 to 70 Gpa;
6) hardness is from about 0.5 to 7 Gpa;
7) density is from about 1.5 to 1.8 g/cm$^3$;
8) dielectric constant is from about 2.2 to 3.3;
9) film stress is from about 30 to 100 Mpa tensile;
10) breakdown voltage is from about 2 to 9 MV/cm at $10^{-3}$ A/cm$^2$; and
11) leakage current at 0.5 MV/cm is from about $<10^{-10}$ to $10^{-12}$ A/cm$^2$.

Anti-reflective layer (ARL) 110 is formed over CVD low-k layer 108, preferably by a PECVD process. ARL layer 110 may be comprised of silicon oxynitride (SiON), SiC, or TiN, and is preferably SiON.

SiON ARL layer 110 is from about 100 to 600 Å thick, and is preferably from about 250 to 320 Å thick.

Define via Pattern

Figure 10:
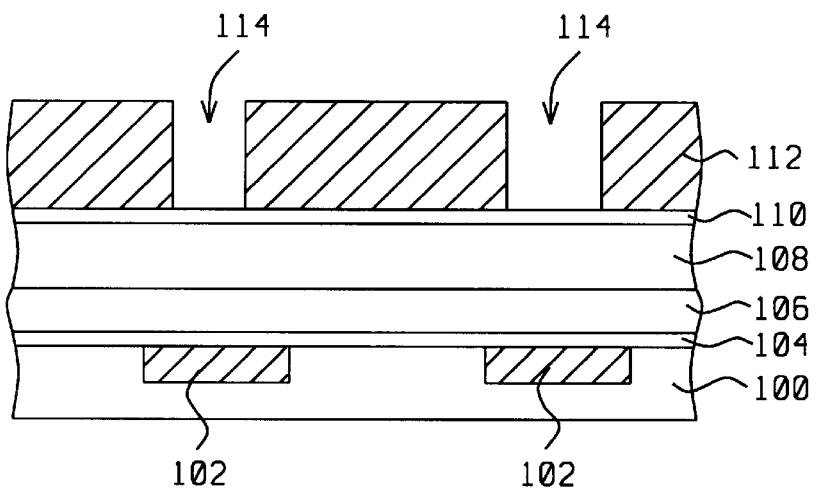

As shown in FIG. 10, first photoresist (PR) layer 112 is formed and patterned over ARL layer 110 to define via pattern 114 exposing selected portions of ARL layer 110.

Etching CVD Low-k Layer 108 to Form via 116

Figure 11:
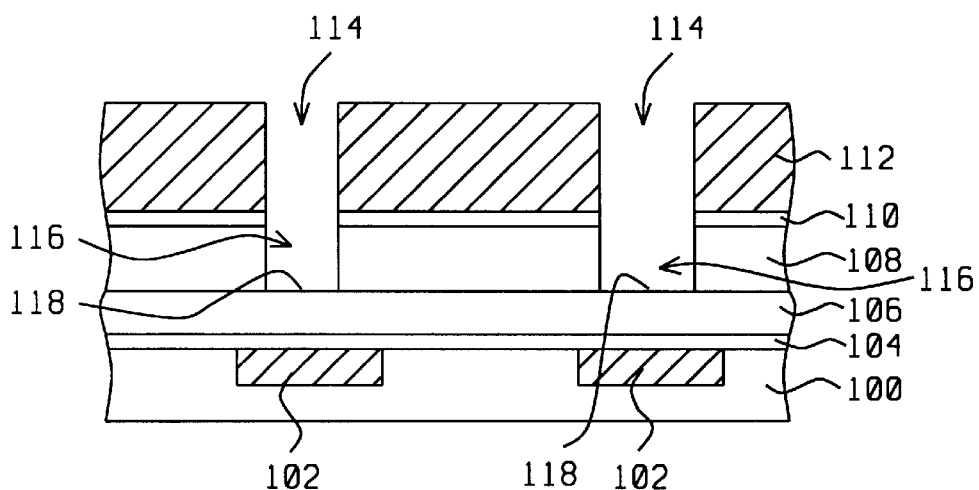

As shown in FIG. 11, exposed ARL layer 110 within via pattern 114, and the corresponding portions of underlying CVD low-k layer 108, are etched down to SOP layer 106 to form CVD low-k layer via openings 116 exposing underlying portions 118 of SOP layer 106. Once this pattern is opened, first PR layer 112 shrinks, reducing its thickness.

$C_2F_6$/Ar (i.e. $C_2F_6$ in an Ar carrier gas) is the major etch process gas in the etching of CVD low-k layer 108. The ratio of $C_2F_6$/Ar is from about 0.1 to 0.5. The power includes TCP and BP power. The transformer coupled plasma (TCP) power is from about 800 to 1200 W. The bias plasma (BP) power is from about 500 to 1500 W. The process pressure is from about 8 to 12 mTorr.

SOP Layer 106 via 118 Formation

Figure 12:
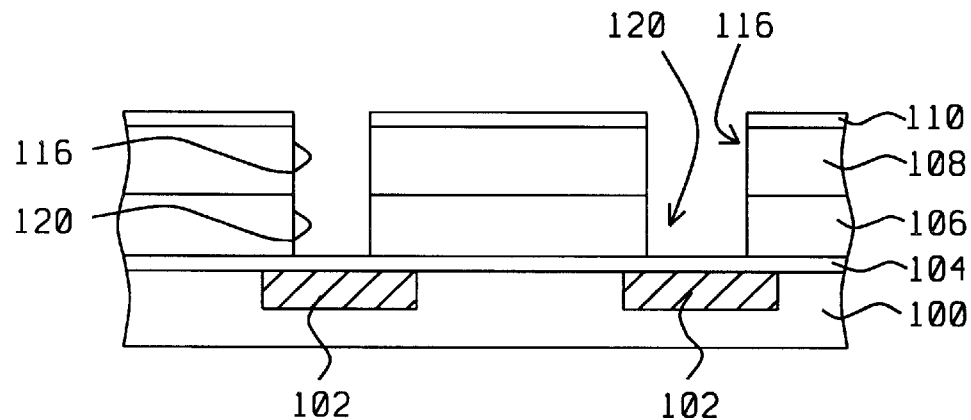

As shown in FIG. 12, first photoresist layer 112 is stripped from the structure.

Exposed portions 118 of SOP layer 106 are etched down to sealing layer 104 using patterned ARL layer 110/etched CVD low-k layer 108 as a mask to form SOP via openings 120.

Nitrogen ($N_2$) and oxygen ($O_2$) are the major process etch process gases in the etching of SOP layer 106. The ratio of $N_2/O_2$ is from about 5 to 12. The power includes TCP and BP power. The TCP power is from about 1000 to 1800 W. The BP power is from about 180 to 250 W.

CVD Low-k Layer 108 Trench 128 Formation

Figure 13:
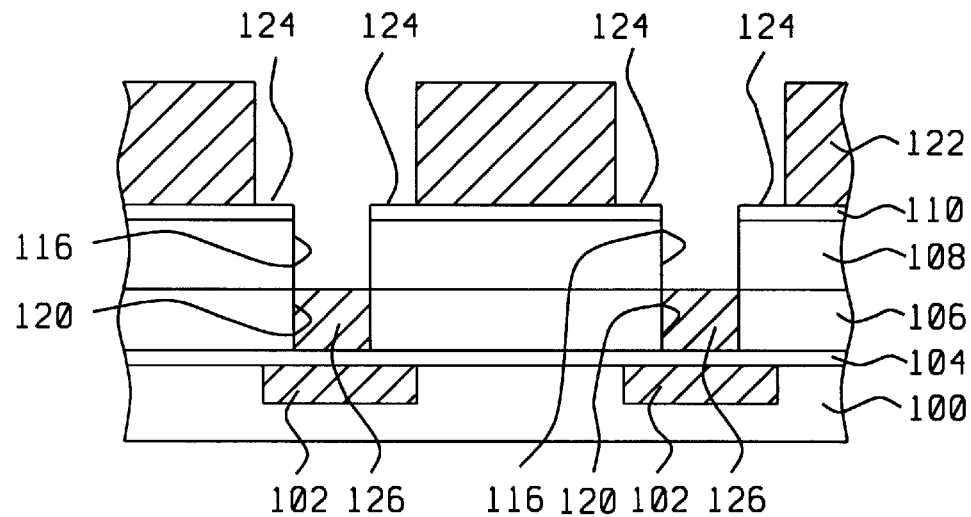

As shown in FIG. 13, second photoresist layer 122 is formed and patterned over the structure exposing selected portions 124 of ARL layer 110/CVD low-k layer 108 adjacent CVD low-k layer via openings 116, and at least a portion of via opening 116. For example, photoresist layer 122 is formed over the structure, filling via openings 116, 120. Photoresist layer 122 is selectively exposed, but not down to the sealing layer 104 over metal lines 102. The exposed portion of photoresist layer 122 is removed leaving at least a portion of SOP layer via openings 120 remain filled with second photoresist layer plugs 126.

Figure 14:
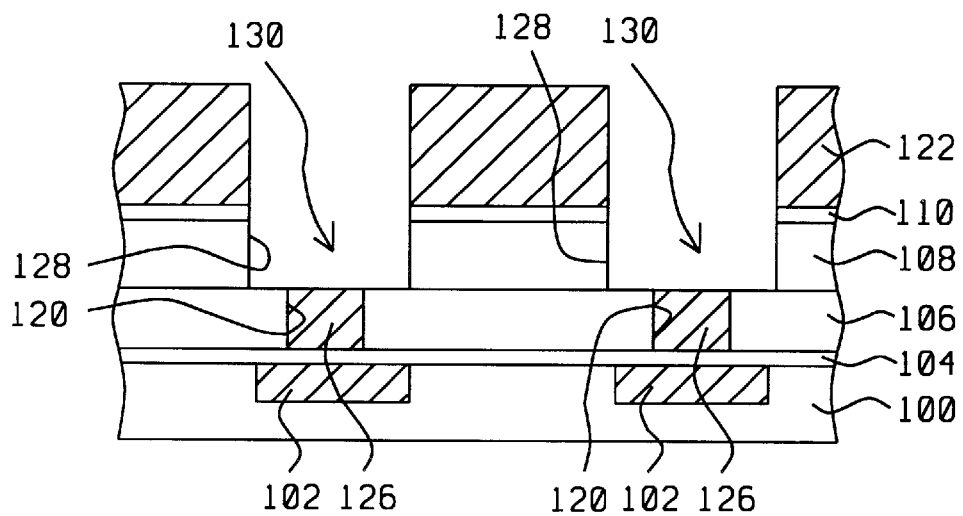

As shown in FIG. 14, using second photoresist layer 122 as a mask, exposed portions 124 of ARL layer 110 and the corresponding portions of underlying CVD low-k layer 108 are etched down to the underlying portions of SOP layer 106 to form CVD low-k layer 108 trenches 128. During the etching of trenches 128, photoresist plugs 126 serve to protect sealing layer 104/metal line 102.

Lower SOP layer 106 via openings 120 and upper CVD low-k layer 108 trenches 128 together form dual damascene openings 130.

Second Photoresist Layer 122 Strip/In-situ Clean of Dual Damascene Openings 130

Figure 15:
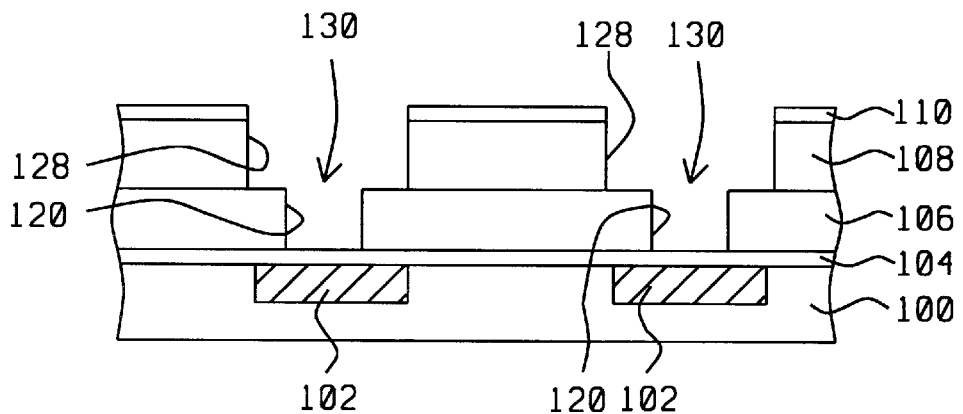

As shown in FIG. 15, remaining second photoresist layer 122, including photoresist plug 126, is stripped from the structure leaving dual damascene openings 130 open. It is noted that a large amount of $O_2$ at 35 mTorr was used by TCP.

Dual damascene openings 130 are then in-situ cleaned to remove any remnants of first and/or second photoresist layers 112, 122.

It is noted that for FLARE and SiLK, the organic low-k material forming SOP low-k layer 106, a spin coater was used in ERSO; and for BD, Coral, and Aurora material, the CVD low-k material forming CVD low-k layer 108, a PECVD machine/tool was used. A low-k etcher was the etch tool used to etch SOP organic low-k layer 106; an oxide etcher was the etch tool used to etch CVD low-k layer 108; and a PR striper was the tool used to strip photoresist layers 112, 122.

Completion of Dual Damascene Structure

Figure 16:
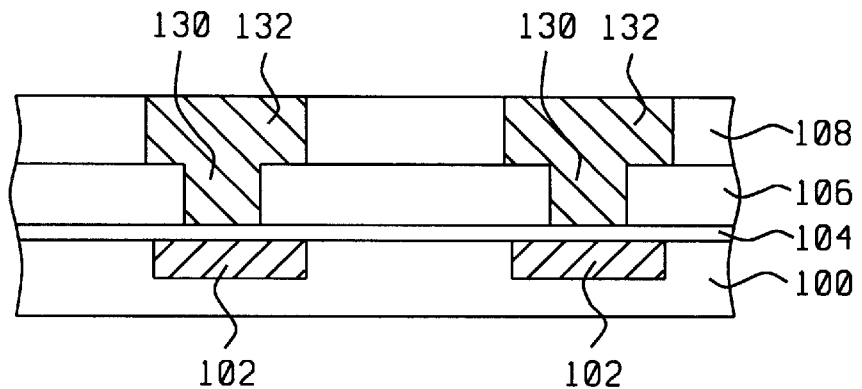

As shown in FIG. 16, the remaining portions of ARL layer 110 are removed. A layer of metal is then formed over the structure, filling dual damascene openings 130. The metal layer is then planarized to remove the excess of the metal from patterned CVD low-k layer 108 and form dual damascene structures 132. Dual damascene structures 132 are preferably formed of copper (Cu).

Advantages of the Present Invention

The advantages of the dual damascene patterning of the present invention include:
1) an etch stop layer is not required (dielectric constant of silicon oxide is about 4.1);
2) the via first and trench first can be performed to achieve the dual damascene structure;
3) the etch process easily achieves a good profile of via or trench;
4) the effective dielectric constant (k) will be reduced compared to the prior process structures (no etch stop layer is required);
5) the effective dielectric constant (k) is maintained;
6) a sacrificial layer is not needed;
7) the processing steps are relatively easy;
8) a silicon oxide hard mask is not required;
9) the adhesion between the CVD low-k layer 108 and the SOP layer 106 is improved; and
10) the total hardness is improved.

While particular embodiments of the present invention have been illustrated and described, it is not intended to limit the invention, except as defined by the following claims.

We claim:

1. A method of forming a dual damascene opening, comprising the steps of:
   providing a semiconductor structure having at least one exposed metal line;
   forming a spin-on-polymer layer over said semiconductor structure and said metal line;
   forming a CVD dielectric material layer upon said spin-on-polymer layer;
   patterning said CVD dielectric material layer to form a CVD dielectric material layer via over said metal line;
   patterning said spin-on-polymer layer to form a spin-on-polymer layer via opening continuous and contiguous with said CVD dielectric material layer via and exposing a portion of said metal line; and
   patterning said CVD dielectric material layer adjacent said CVD dielectric material layer via to form a CVD dielectric material layer trench; said spin-on-polymer layer via opening and said CVD dielectric material layer trench forming a dual damascene opening.

2. The method of claim 1, wherein said SOP layer is formed using a spin coater with a baking step at from about 50 to 280° C. for from about 10 to 90 seconds followed by a curing step at from about 300 to 450° C. for from about 30 to 90 minutes.

3. The method of claim 1, wherein said CVD dielectric layer includes from about 5 to 50% by FTIR; from about 10 to 30% oxygen; and from about 10 to 30% hydrogen.

4. The method of claim 1, wherein said spin-on-polymer layer is from about 1000 to 9000 Å thick, and said CVD dielectric material layer is from about 1000 to 9000 Å thick.

5. The method of claim 1, wherein said spin-on-polymer layer 106 is from about 3000 to 6000 Å thick, and said CVD dielectric material layer 108 is from about 3000 to 6000 Å thick.

6. The method of claim 1, including the steps of:
   forming a sealing layer over said semiconductor structure and said metal line; and
   forming an anti-reflection layer over said CVD dielectric material layer.

7. The method of claim 1, wherein said spin-on-polymer layer is comprised of a material selected from the group comprising SiLK, FLARE, and $CH_3$—$SiO_2$.

8. The method of claim 1, wherein said spin-on-polymer layer is comprised of the elements C, H, O, and Si with at least an arylate series functional group.

9. The method of claim 1, wherein said CVD dielectric material layer is comprised of a material selected from the group comprising BD, silicon oxide, Coral™, povA, Greendot™, and carbon doped silicon oxide.

10. The method of claim 1, wherein said CVD dielectric material layer is comprised of silicon oxide.

11. The method of claim 1, wherein said SOP layer has the following characteristics:
   1) RI is from about 1.35 to 1.43;
   2) carbon content by FTIR is from about 30 to 65%;
   3) oxygen content is from about 10 to 30%;
   4) hydrogen content is from about 30 to 65%;
   5) silicon content is from about 1 to 10%;
   6) hardness is from about 0.5 to 3 Gpa;
   7) density is from about 1.5 to 1.8 $g/cm^3$;
   8) dielectric constant is from about 2.0 to 2.9;
   9) stress is from about compressive $10E^{-8}$ to tensile $10E^{-8}$;
   10) breakdown voltage is from about 2 to 9 MV/cm at $10^{-3}$ $A/cm^2$;
   11) leakage current at 0.5 MV/cm is from about $<10^{-10}$ to $10^{-12}$ $A/cm^2$; and
   12) extinction coefficient is from about 0 to 1.

12. The method of claim 1, wherein said CVD dielectric layer has the following characteristics:
   1) RI is from about 1.30 to 1.67;
   2) carbon content by FTIR is from about 5 to 50%;
   3) oxygen content is from about 10 to 30%;
   4) hydrogen content is from about 10 to 30%;
   5) modulus is from about 40 to 70 Gpa;
   6) hardness is from about 0.5 to 7 Gpa;
   7) density is from about 1.5 to 1.8 $g/cm^3$;
   8) dielectric constant is from about 2.2 to 3.3;
   9) film stress is from about 30 to 100 Mpa tensile;
   10) breakdown voltage is from about 2 to 9 MV/cm at $10^{-3}$ $A/cm^2$; and
   11) leakage current at 0.5 MV/cm is from about $<10^{-10}$ to $10^{-12}$ $A/cm^2$.

13. A method of forming a dual damascene opening, comprising the steps of:
   providing a semiconductor structure having at least one exposed metal line;
   forming a sealing layer over said semiconductor structure and said metal line;
   forming a spin-on-polymer layer over said sealing layer;
   forming a CVD dielectric material layer upon said spin-on-polymer layer;
   forming an anti-reflection layer over said CVD dielectric material layer;
   patterning said anti-reflection layer and said CVD dielectric material layer to form a CVD dielectric material layer via over said metal line;
   patterning said spin-on-polymer layer to form a spin-on-polymer layer via opening continuous and contiguous with said CVD dielectric material layer via and exposing a portion of said metal line; and
   patterning said anti-reflection layer and said CVD dielectric material layer adjacent said CVD low-k material layer via to form a CVD dielectric material layer trench; said spin-on-polymer layer via opening and said CVD dielectric material layer trench forming a dual damascene opening.

14. The method of claim 13, wherein said SOP layer is formed using a spin coater with a baking step at from about 50 to 280° C. for from about 10 to 90 seconds followed by a curing step at from about 300 to 450° C. for from about 30 to 90 minutes.

15. The method of claim 13, wherein said CVD dielectric layer includes from about 5 to 50% by FTIR; from about 10 to 30% oxygen; and from about 10 to 30% hydrogen.

16. The method of claim 13, wherein said spin-on-polymer layer is from about 1000 to 9000 Å thick, and said CVD dielectric material layer is from about 1000 to 9000 Å thick.

17. The method of claim 13, wherein said spin-on-polymer layer is from about 3000 to 6000 Å thick, and said CVD dielectric material layer 108 is from about 3000 to 6000 Å thick.

18. The method of claim 13, wherein said spin-on-polymer layer is comprised of a material selected from the group comprising SiLK, FLARE, and $CH_3$—$SiO_2$.

19. The method of claim 13, wherein said spin-on-polymer layer is comprised of the elements C, H, O, and Si with at least an arylate series functional group.

20. The method of claim 13, wherein said CVD dielectric material layer is comprised of a material selected from the group comprising BD, silicon oxide, Coral™, povA, Greendot™, and carbon doped silicon oxide.

21. The method of claim 13, wherein said CVD dielectric material layer is comprised of silicon oxide.

22. The method of claim 13, wherein said sealing layer is comprised of silicon nitride.

23. The method of claim 13, wherein said anti-reflection layer is comprised of SiON.

24. A method of forming a dual damascene opening, comprising the steps of:
   providing a semiconductor structure having at least one exposed metal line;
   forming a silicon nitride layer over said semiconductor structure and said metal line;
   forming a spin-on-polymer layer over said sealing layer;
   forming a CVD dielectric material layer upon said spin-on-polymer layer;
   forming an SiON layer over said CVD dielectric material layer;
   patterning said SiON layer and said CVD dielectric material layer to form a CVD dielectric material layer via over said metal line;
   patterning said spin-on-polymer layer to form a spin-on-polymer layer via opening continuous and contiguous with said CVD dielectric material layer via and exposing a portion of said metal line; and
   patterning said SiON layer and said CVD dielectric material layer adjacent said CVD dielectric material layer via to form a CVD dielectric material layer trench; said spin-on-polymer layer via opening and said CVD dielectric material layer trench forming a dual damascene opening.

25. The method of claim 24, wherein said SOP layer is formed using a spin coater with a baking step at from about 50 to 280° C. for from about 10 to 90 seconds followed by a curing step at from about 300 to 450° C. for from about 30 to 90 minutes.

26. The method of claim 24, wherein said CVD dielectric layer includes from about 5 to 50% by FTIR; from about 10 to 30% oxygen; and from about 10 to 30% hydrogen.

27. The method of claim 24, wherein said spin-on-polymer layer is from about 1000 to 9000 Å thick, and said CVD dielectric material layer is from about 1000 to 9000 Å thick.

28. The method of claim 24, wherein said spin-on-polymer layer is from about 3000 to 6000 Å thick, and said CVD dielectric material layer is from about 3000 to 6000 Å thick.

29. The method of claim 24, wherein said spin-on-polymer layer is comprised of a material selected from the group comprising SiLK, FLARE, and $CH_3$—$SiO_2$.

30. The method of claim 24, wherein said spin-on-polymer layer is comprised of the elements C, H, O, and Si with at least an arylate series functional group.

31. The method of claim 24, wherein said CVD dielectric material layer is comprised of a material selected from the group comprising BD, silicon oxide, Coral™, povA, Greendot™, and carbon doped silicon oxide.

32. The method of claim 24, wherein said CVD dielectric material layer is comprised of silicon oxide.

33. The method of claim 24, wherein said SOP layer has the following characteristics:
   1) RI is from about 1.35 to 1.43;
   2) carbon content by FTIR is from about 30 to 65%;
   3) oxygen content is from about 10 to 30%;
   4) hydrogen content is from about 30 to 65%;
   5) silicon content is from about 1 to 10%;
   6) hardness is from about 0.5 to 3 Gpa;
   7) density is from about 1.5 to 1.8 g/cm$^3$;
   8) dielectric constant is from about 2.0 to 2.9;
   9) stress is from about compressive $10E^{-8}$ to tensile $10E^{-8}$;
   10) breakdown voltage is from about 2 to 9 MV/cm at $10^3$ A/cm$^2$;
   11) leakage current at 0.5 MV/cm is from about $<10^{-10}$ to $10^{-12}$ A/cm$^2$; and
   12) extinction coefficient is from about 0 to 1.

34. The method of claim 24, wherein said CVD dielectric layer has the following characteristics:
   1) RI is from about 1.30 to 1.67;
   2) carbon content by FTIR is from about 5 to 50%;
   3) oxygen content is from about 10 to 30%;
   4) hydrogen content is from about 10 to 30%;
   5) modulus is from about 40 to 70 Gpa;
   6) hardness is from about 0.5 to 7 Gpa;
   7) density is from about 1.5 to 1.8 g/cm$^3$;
   8) dielectric constant is from about 2.2 to 3.3;
   9) film stress is from about 30 to 100 Mpa tensile;
   10) breakdown voltage is from about 2 to 9 MV/cm at $10^{-3}$ A/cm$^2$; and
   11) leakage current at 0.5 MV/cm is from about $<10^{-10}$ to $10^{-2}$ A/cm$^2$.

35. The method of claim 1, wherein said CVD dielectric material layer has a dielectric constant of from about 2.2 to 3.3.

36. The method of claim 13, wherein said CVD dielectric material layer has a dielectric constant of from about 2.2 to 3.3.

37. The method of claim 24, wherein said CVD dielectric material layer has a dielectric constant of from about 2.2 to 3.3.

* * * * *